(12) United States Patent
Lee et al.

(10) Patent No.: US 10,969,987 B2
(45) Date of Patent: Apr. 6, 2021

(54) MEMORY DEVICE, MEMORY SYSTEM INCLUDING THE MEMORY DEVICE, AND METHOD OF OPERATING THE MEMORY SYSTEM

(71) Applicant: SK hynix Inc., Gyeonggi-do (KR)

(72) Inventors: Hyun Woo Lee, Gyeonggi-do (KR); Young Gyun Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/395,890

(22) Filed: Apr. 26, 2019

(65) Prior Publication Data

US 2020/0133501 A1 Apr. 30, 2020

(30) Foreign Application Priority Data

Oct. 25, 2018 (KR) .......................... 10-2018-0128424

(51) Int. Cl.
*G06F 3/06* (2006.01)
*G06F 11/10* (2006.01)
(Continued)

(52) U.S. Cl.
CPC .............. *G06F 3/065* (2013.01); *G06F 3/064* (2013.01); *G06F 3/0619* (2013.01); *G06F 3/0673* (2013.01); *G06F 11/1068* (2013.01); *G11C 29/52* (2013.01); *G06F 12/0246* (2013.01); *G06F 2212/7211* (2013.01); *G11C 11/5628* (2013.01); *G11C 11/5642* (2013.01); *G11C 13/004* (2013.01); *G11C 16/16* (2013.01); *G11C 16/26* (2013.01); *G11C 16/349* (2013.01);
(Continued)

(58) Field of Classification Search
CPC . G11C 11/5642; G11C 16/26; G11C 11/5628; G11C 16/349; G11C 29/52; G11C 2211/5641; G11C 16/3418; G11C 13/004; G11C 16/3427; G11C 16/16; G11C 12/0246; G11C 3/0619; G11C 2212/7211; G11C 11/1068; G11C 3/0673; G11C 3/064; G11C 3/065
See application file for complete search history.

(56) References Cited

U.S. PATENT DOCUMENTS 8,266,501 B2 9/2012 Jeddeloh
2014/0059406 A1* 2/2014 Hyun .................. G11C 11/5621
714/773
(Continued)

FOREIGN PATENT DOCUMENTS

KR 10-2015-0140496 12/2015
KR 10-2018-0014975 2/2018

*Primary Examiner* — April Y Blair
*Assistant Examiner* — Sazzad Hossain
(74) *Attorney, Agent, or Firm* — IP & T Group LLP

(57) ABSTRACT

A memory system includes: a memory cell array including a plurality of memory blocks; a peripheral circuit configured to perform a read operation on a selected memory block among the plurality of memory blocks and a backup program operation on a backup block among the plurality of memory blocks; and a control circuit configured to control the peripheral circuit to backup data of logical pages included in the selected memory block in the backup block, when a read count of a selected physical page of the selected memory block is equal to or larger than a set value in the read operation on the selected memory block.

17 Claims, 10 Drawing Sheets

(51) Int. Cl.
*G11C 29/52* (2006.01)
*G11C 16/34* (2006.01)
*G06F 12/02* (2006.01)
*G11C 11/56* (2006.01)
*G11C 16/26* (2006.01)
*G11C 13/00* (2006.01)
*G11C 16/16* (2006.01)

(52) U.S. Cl.
CPC ...... *G11C 16/3418* (2013.01); *G11C 16/3427* (2013.01); *G11C 2211/5641* (2013.01)

(56) References Cited

U.S. PATENT DOCUMENTS

| | | | |
|---|---|---|---|
| 2015/0006792 A1* | 1/2015 | Lee | G06F 3/0616 |
| | | | 711/103 |
| 2017/0220415 A1* | 8/2017 | Hashimoto | G06F 3/064 |
| 2020/0075110 A1* | 3/2020 | Suzuki | G11C 16/3431 |

* cited by examiner

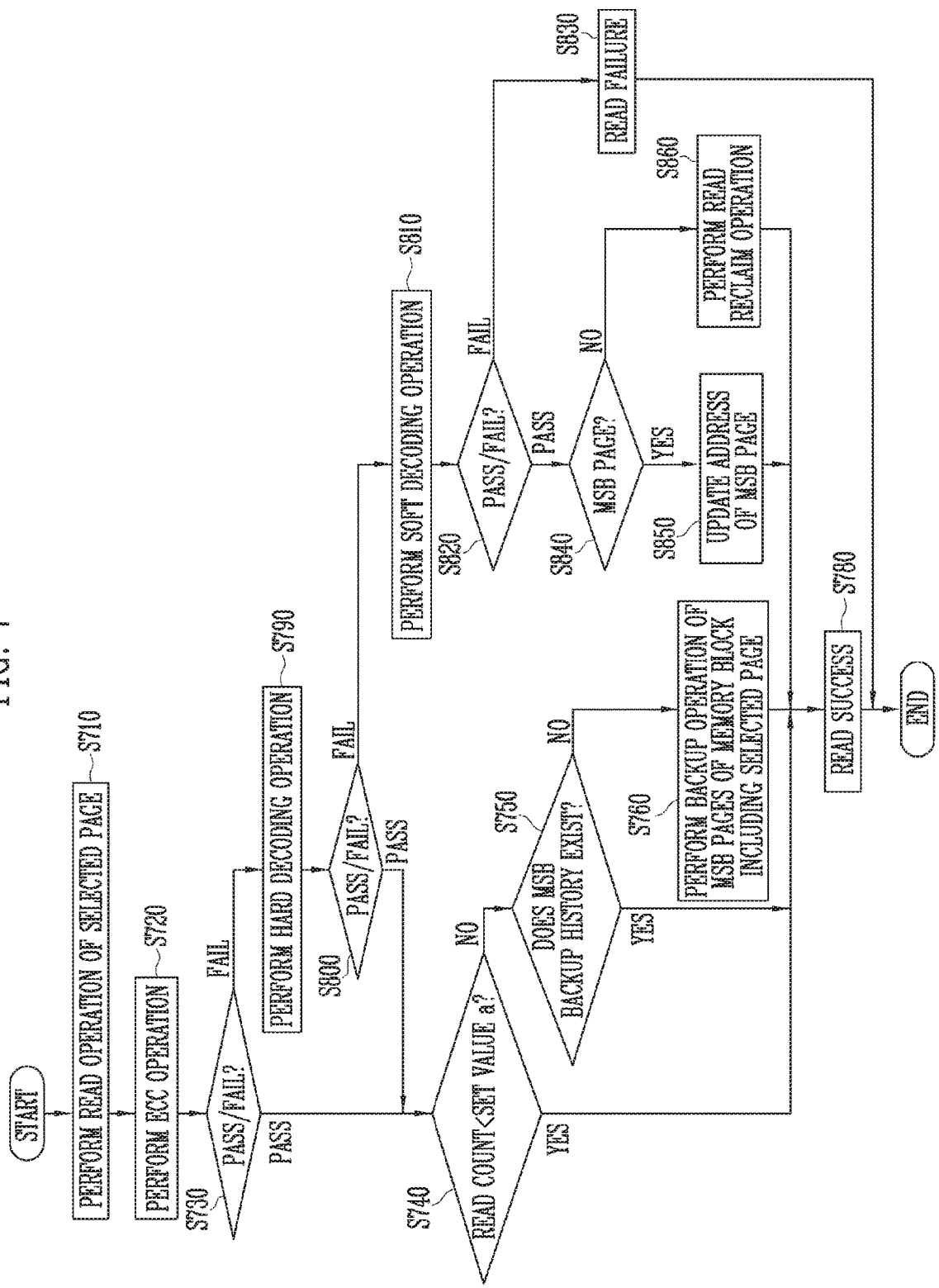

MEMORY DEVICE, MEMORY SYSTEM INCLUDING THE MEMORY DEVICE, AND METHOD OF OPERATING THE MEMORY SYSTEM

CROSS-REFERENCE TO RELATED APPLICATION

The present application claims priority under 35 U.S.C. § 119(a) to Korean patent application number 10-2018-0128424 filed on Oct. 25, 2018, the entire disclosure of which is incorporated herein by reference in its entirety.

BACKGROUND

Field of Invention

The present disclosure generally relates to an electronic device, and more particularly, to a memory device, a memory system including the memory device, and a method of operating the memory system.

Description of Related Art

The paradigm on recent computer environment has been turned into ubiquitous computing environment in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device includes a Universal Serial Bus (USB) memory device, memory cards having various interfaces, a Solid State Drive (SSD), and the like.

SUMMARY

Embodiments provide a memory device capable of maximally ensuring the lifespan of a memory system by efficiently managing a page weak due to a read disturb in a read operation of the memory system, a memory system including the memory device, and a method of operating the memory system.

In accordance with an aspect of the present disclosure, there is provided a memory device including: a memory cell array including a plurality of memory blocks; a peripheral circuit configured to perform a read operation on a selected memory block among the plurality of memory blocks and a backup program operation on a backup block among the plurality of memory blocks; and a control circuit configured to control the peripheral circuit to backup data of logical pages included in the selected memory block in the backup block, when a read count of a selected physical page of the selected memory block is equal to or larger than a set value in the read operation on the selected memory block.

In accordance with another aspect of the present disclosure, there is provided a memory system including: a memory device including a plurality of memory blocks, the memory device reading and outputting data stored in a selected page of a selected memory block among the plurality of memory blocks in a read operation; and a controller configured to control the memory device to perform the read operation in response to a request from a host, wherein the controller controls, when a read count of the selected page is equal to or larger than a set value in the read operation, the memory device to perform a backup operation of storing data of weak logical pages included in the selected memory block including the selected page in a backup block among the plurality of memory blocks.

In accordance with still another aspect of the present disclosure, there is provided a method of operating a memory system, the method including: performing a read operation on a selected page included in a selected memory block among a plurality of memory blocks and an Error Correction Code (ECC) operation on read data; comparing a read count of the selected page with a set value, when it is determined that the ECC operation has passed; and performing a backup operation of weak logical pages included in the selected memory block, when the read count is equal to or larger than the set value.

In accordance with another aspect of the present disclosure, there is provided a memory system including: a memory device including memory blocks; and a controller configured to: control the memory device to backup, into a location within a second memory block, most significant bit (MSB) page data of a first memory block when a read count of a physical page corresponding to the MSB page becomes a set value or greater; and update an address of the MSB page to an address of the backed-up location when the MSB page becomes a target of a read operation.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 7 is a flowchart illustrating a method for operating the memory system in accordance with an embodiment of the present disclosure.

DETAILED DESCRIPTION

Figure 1:
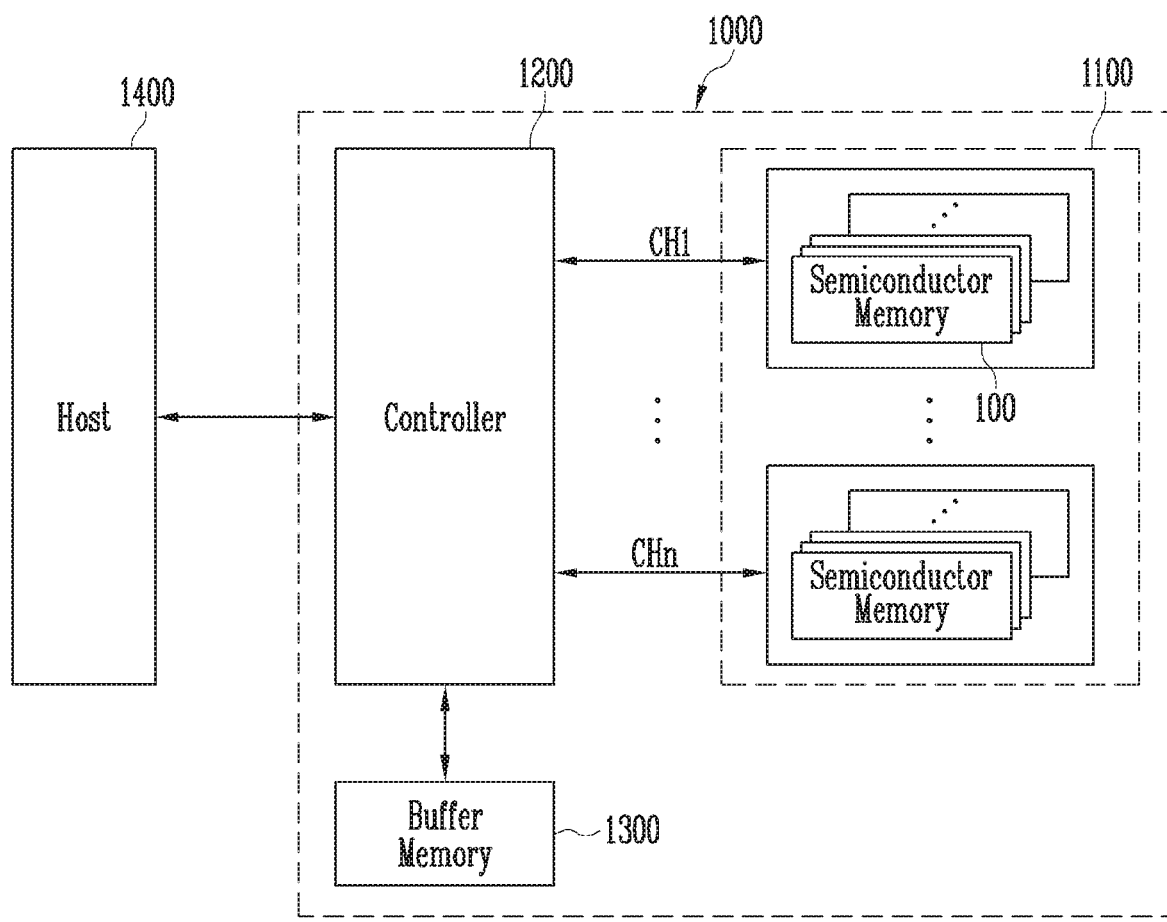
FIG. 1 is a block diagram illustrating a memory system in accordance with an embodiment of the present disclosure.

The specific structural or functional description disclosed herein is merely illustrative for the purpose of describing embodiments in accordance with the concept of the present disclosure. The embodiments in accordance with the concept of the present disclosure can be implemented in various forms, and cannot be construed as limited to the embodiments set forth herein.

The embodiments in accordance with the concept of the present disclosure can be variously modified and have various shapes. Thus, the embodiments are illustrated in the drawings, and are intended to be described herein in detail. However, the embodiments in accordance with the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "between," "Immediately between" or "adjacent to" and "directly adjacent to" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be interpreted in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a block diagram illustrating a memory system in accordance with an embodiment of the present disclosure.

Referring to FIG. 1, the memory system 1000 includes a memory device 1100, a controller 1200, and a buffer memory 1300.

The memory device 1100 includes a plurality of semiconductor memories 100. The plurality of semiconductor memories 100 may be divided into a plurality of groups.

FIG. 1 illustrates that the plurality of groups communicate with the controller 1200 respectively through first to nth channels CH1 to CHn. Each semiconductor memory 100 will be described later with reference to FIG. 3.

Each group communicates with the controller 1200 through one common channel. The controller 1200 controls the plurality of semiconductor memories 100 of the memory device 1100 through the plurality of channels CH1 to CHn.

The controller 1200 is coupled between a host 1400 and the memory device 1100. The controller 1200 accesses the memory device 1100 in response to a command received from the host 1400. For example, the controller 1200 controls overall operations such as read, program, erase, and background operations of the memory device 1100 in response to a command received from the host 1400. The controller 1200 provides an interface between the memory device 1100 and the host 1400. The controller 1200 drives firmware for controlling the memory device 1100.

When a read count of a selected page of a memory block is equal to or larger than a predetermined or set threshold in a read operation of the plurality of semiconductor memories 100 included in the memory device 1100, the controller 1200 may determine that it is highly likely that a read disturb will occur in the selected page, and control the memory device 1100 to perform a data backup operation of a page (e.g., a Most Significant Bit (MSB) page) vulnerable to the read disturb among a plurality of logical pages (e.g., a Least Significant Bit (LSB) page, a Central Significant Bit (CSB) page, and the MSB page) corresponding to the selected page. Also, when a hard decoding and soft decoding operation is performed since an Error Correction Code (ECC) operation of the selected page of the memory block falls in the read operation of the plurality of semiconductor memories 100 included in the memory device 1100, the controller 1200 may perform a read reclaim operation of copying data from the selected page into a page of another memory block when the selected page is an LSB page or CSB page.

The buffer memory 1300 may temporarily store data read from the memory device 1100 in a read operation and then output the data to the host 1400 in response to a request from the host 1400, or temporarily store data received from the host 1400 in a program operation and then output the data to the memory device 1100. In the embodiment of the present disclosure, the buffer memory 1300 is illustrated and described as a component separate from the controller 1200, but the controller 1200 may be configured to include the buffer memory 1300.

The host 1400 controls the memory system 1000. The host 1400 includes portable electronic devices such as a computer, a PDA, a PMP, an MP3 player, a camera, a camcorder, and a mobile phone. The host 1400 may request a program, read or erase operation of the memory system 1000 through a command.

The controller 1200 and the memory device 1100 may be integrated into one semiconductor device. In an exemplary embodiment, the controller 1200 and the memory device 1100 may be integrated into one semiconductor device, to constitute a memory card. For example, the controller 1200 and the memory device 1100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

The controller 1200 and the memory device 1100 may be integrated into one semiconductor device to constitute a semiconductor drive (Solid State Drive (SSD)). The semiconductor drive SSD includes a storage device configured to store data in a semiconductor memory. If the memory system 1000 is used as the semiconductor drive SSD, the operating speed of the host 1400 coupled to the memory system 1000 can be remarkably improved.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory device 1100 or the memory system 1000 may be packaged in various forms. For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
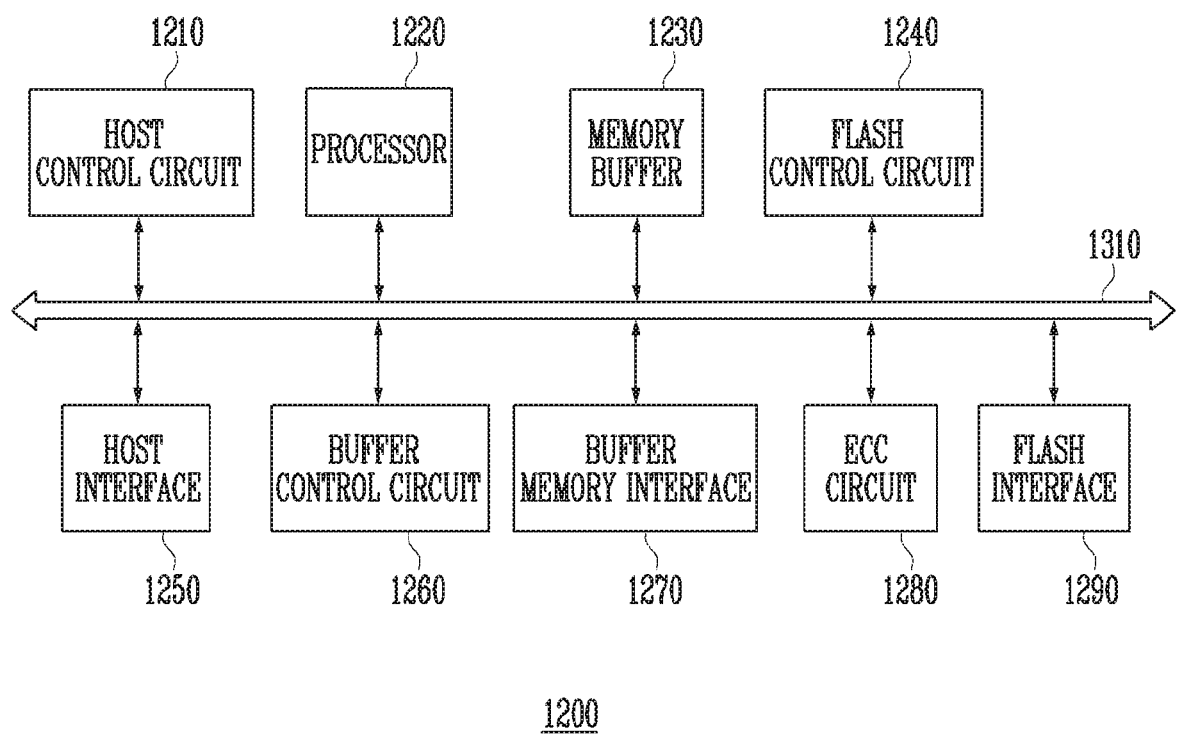
FIG. 2 is a block diagram illustrating a configuration of a controller of FIG. 1.

FIG. 2 is a block diagram illustrating a configuration of the controller of FIG. 1.

Referring to FIG. 2, the controller 1200 may include a host control circuit 1210, a processor 1220, a memory buffer 1230, a flash control circuit 1240, a host interface 1250, a buffer control circuit 1260, a buffer memory interface 1270, an ECC circuit 1280, a flash interface 1290, and a bus 1310.

The bus 1310 may provide a channel between components of the controller 1200.

The host control circuit 1210 may control data transmission between the host 1400 of FIG. 1 and the host interface 1250 and a controller buffer memory, i.e., the memory buffer 1230 or the buffer memory 1300 of FIG. 1. In an example, the host control circuit 1210 may control an operation of buffering data input from the host 1400 to the memory buffer 1230 or the buffer memory 1300 through the host interface 1250. In another example, the host control circuit 1210 may control an operation outputting the data buffered to the memory buffer 1230 or the buffer memory 1300 to the host 1400 through the host interface 1250.

The processor 1220 may control the overall operations of the controller 1200, and perform a logical operation. The processor 1220 may communicate with the host 1400 of FIG. 1 through the host interface 1250, and communicate with the memory device 1100 of FIG. 1 through the flash interface 1290. Also, the processor 1220 may communicate with the buffer memory 1300 of FIG. 1 through the buffer memory interface 1270. Also, the processor 1220 may control the memory buffer 1230 through the buffer control circuit 1260. The processor 1220 may control an operation of the memory system 1000 by using the memory buffer 1230 as a working memory, a cache memory or a buffer memory. Also, the processor 1220 drives firmware called as a Flash Translation Layer (hereinafter, referred to as 'FLT') so as to control the overall operations of the controller 1200. The FTL may be stored in the memory buffer 1230.

The processor 1220 may generate a plurality of command queues by aligning commands received from the host 1400 according to an order of priority. The plurality of command queues preferably correspond to the plurality of semiconductor memories 100 of the memory device 1100, respectively.

When a read count of a selected page of a memory block is equal to or larger than a predetermined threshold in a read operation of the plurality of semiconductor memories 100 included in the memory device 1100, the processor 1220 may generate a command for controlling the memory device 1100 to perform a data backup operation of a page (e.g., a Most Significant Bit (MSB) page) vulnerable to a read disturb among a plurality of logical pages (e.g., a Least Significant Bit (LSB) page, a Central Significant Bit (CSB) page, and the MSB page) corresponding to the selected page, and queue the generated command in a command queue corresponding to the selected semiconductor memory. Also, when a hard decoding and soft decoding operation is performed since an ECC operation of the selected page of the memory block falls in the read operation of the plurality of semiconductor memories 100 included in the memory device 1100, the processor 1220 may generate a command for controlling the memory device 1100 to perform a read reclaim operation of copying data from the selected page into a page of another memory block when the selected page is an LSB page or CSB page, and queue the generated command in a command queue corresponding to the selected semiconductor memory.

The memory buffer 1230 may be used as a working memory, cache memory or data buffer memory of the processor 1220. The memory buffer 1230 may store codes and commands, which are executed by the processor 1220. The memory buffer 1230 may store data processed by the processor 1220. The memory buffer 1230 may include a Static RAM (SRAM) or Dynamic RAM (DRAM). The memory buffer 1230 may store a plurality of commands queued by the processor 1220.

The flash control circuit 1240 outputs a command for controlling the plurality of semiconductor memories 100 of the memory device 1100 in response to a plurality of command queues. In an example, the flash control circuit 1240 may be included as a component of the processor 1220 in the processor 1220.

The host interface 1250 is configured to communicate with the host 1400 of FIG. 1 under the control of the processor 1220. The host interface 1250 may be configured to communicate with the host 1400, using at least one of various communication interfaces, such as a Universal Serial Bus (USB), a Serial AT Attachment (SATA), a High Speed InterChip (HSIC), a Small Computer System Interface (SCSI), Firewire, a Peripheral Component Interconnection (PCI), a PCI express (PCIe), a Nonvolatile Memory Express (NVMe), a Universal Flash Storage (UFS), a Secure Digital (SD), a Multi-Media Card (MMC), an Embedded MMC (eMMC), a Dual In-line Memory Module (DIMM), a Registered DIMM (RDIMM), and a Load Reduced DIMM (LRDIMM).

The buffer control circuit 1260 may control the memory buffer 1230 under the control of the processor 1220.

The buffer memory interface 1270 may communicate with the buffer memory 1300 under the control of the processor 1220. The buffer memory interface 1270 may communicate a command, an address, and data with the buffer memory 1300 through a channel.

The ECC circuit 1280 may perform an ECC operation. The ECC circuit 1280 may perform ECC encoding, based on data to be written to the memory device 1100 of FIG. 1 through the flash interface 1290. The ECC-encoded data may be transferred to the memory device 1100 through the flash interface 1290. The ECC circuit 1280 may perform ECC decoding on data received from the memory device 1100 through the flash interface 1290. In an example, the ECC circuit 1280 may be included as a component of the flash interface 1290 in the flash interface 1290.

The flash interface 1290 communicates with the memory device 1100 of FIG. 1 under the control of the processor 1220. The flash interface 1290 may communicate command control signals, an address, and data with the memory device 1100 through a channel.

Figure 3:
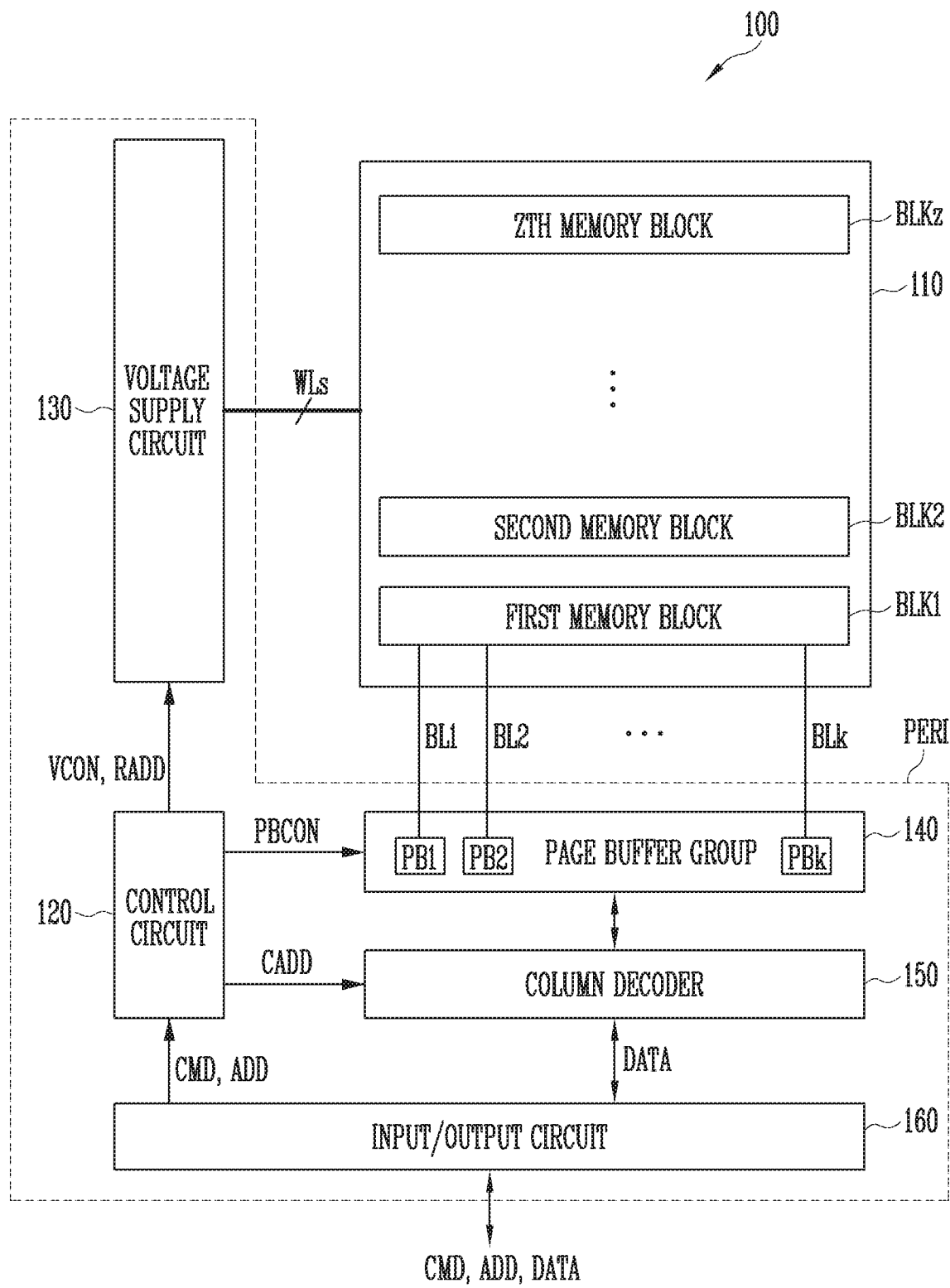
FIG. 3 is a block diagram illustrating a semiconductor memory of FIG. 1.

FIG. 3 is a block diagram illustrating the semiconductor memory of FIG. 1.

Referring to FIG. 3, the semiconductor memory 100 includes a memory cell array 110 including a plurality of memory blocks BLK1 to BLKz, and a peripheral circuit PERI configured to perform a program, read or erase operation of memory cells included in a selected page of the plurality of memory blocks BLK1 to BLKz. The peripheral circuit PERI includes a control circuit 120, a voltage supply circuit 130, a page buffer group 140, a column decoder 150, and an input/output circuit 160.

The memory cell array includes a plurality of memory blocks BLK1 to BLKz. Each of the plurality of memory blocks BLK1 to BLKz includes a plurality of pages. Each of the plurality of pages includes a plurality of memory cells. In an embodiment, the plurality of memory cells may be nonvolatile memory cells. This will be described in more detail with reference to FIGS. 4 and 5.

The control circuit 120 outputs a voltage control signal VCON for generating a voltage required to perform a read, program or erase operation in response to an internal command CMD input through the input/output circuit 160, and outputs a PB control signal PBCON for controlling page buffers PB1 to PBk Included in the page buffer group 140 according to the type of operation. Also, the control circuit 120 outputs a row address signal RADD and a column address signal CADD in response to an address signal ADD input from the outside through the input/output circuit 160.

The voltage supply circuit 130 supplies operating voltages required to perform program, read, and erase operations of memory cells in response to the voltage control signal VCON of the control circuit 120 to local lines including a drain select line, word lines WLs, and a source select line of a selected memory block. The voltage supply circuit 130 includes a voltage generating circuit and a row decoder.

The voltage generating circuit outputs operating voltages required to perform program, read, and erase operations of memory cells to global lines in response to the voltage control signal VCON of the control circuit 120.

The row decoder couples the global lines and the local lines such that the operating voltages output to the global lines by the voltage generating circuit can be transferred to the local lines of the selected memory block in the memory cell array 110, in response to row address signals RADD of the control circuit 120.

The page buffer group 140 includes a plurality of page buffers PB1 to PBk coupled to the memory cell array 110 respectively through bit lines BL1 to BLk. The page buffers PB1 to PBk of the page buffer group 140 selectively precharge the bit lines BL1 to BLk according to input data DATA so as to store the data DATA in the memory cells in response to the PB control signal PBCON of the control circuit 120, or sense voltages of the bit lines BL1 to BLk so as to read the data DATA from the memory cells.

The column decoder 150 selects the page buffers PB1 to PBk Included in the page buffer group 140 in response to the column address signal CADD output from the control circuit 120. That is, the column decoder 150 sequentially transfers data DATA to be stored in the memory cells to the page buffers PB1 to PBk in response to the column address signal CADD. Also, the column decoder 150 sequentially selects the page buffers PB1 to PBk in response to the column address signal CADD such that data DATA of the memory cells, which are latched to the page buffers PB1 to PBk in a read operation, can be output to the outside.

In order to input, to the page buffer group 140, data DATA input to be stored in the memory cells in a program operation, the input/output circuit 160 transfers the data DATA to the column decoder 150 under the control of the control circuit 120. When the column decoder 150 transfers the data DATA transferred from the input/output circuit 160 to the page buffers PB1 to PBk of the page buffer group 140, the page buffers PB1 to PBk store the input data DATA to latch circuits therein. Also, in a read operation, the input/output circuit 160 outputs, to the outside, the data DATA transferred from the page buffers PB1 to PBk of the page buffer group 140 through the column decoder 150.

Figure 4:
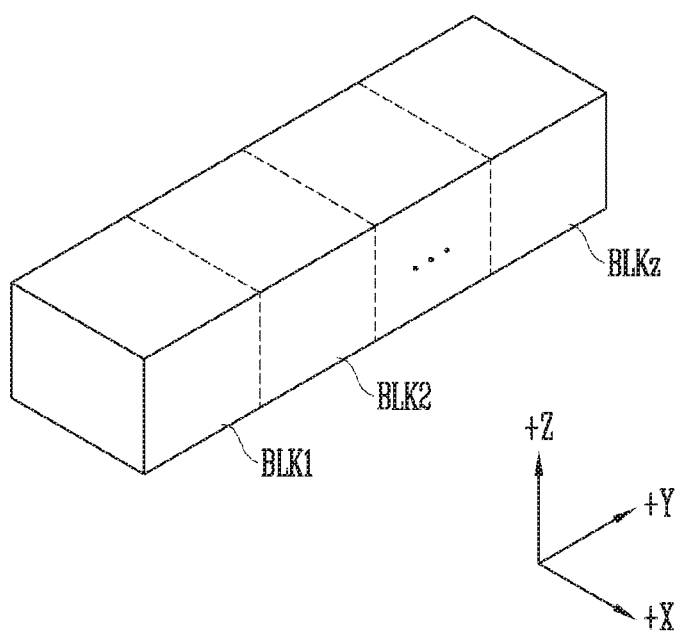
FIG. 4 is a block diagram illustrating an embodiment of a memory cell array of FIG. 3.

FIG. 4 is a block diagram illustrating an embodiment of the memory cell array of FIG. 3.

Referring to FIG. 4, the memory cell array 110 includes a plurality of memory blocks BLK1 to BLKz. Each memory block has a three-dimensional structure. Each memory block includes a plurality of memory cells stacked above a substrate. The plurality of memory cells are arranged along +X, +Y, and +Z directions. The structure of each memory block will be described in more detail with reference to FIG. 5.

Figure 5:
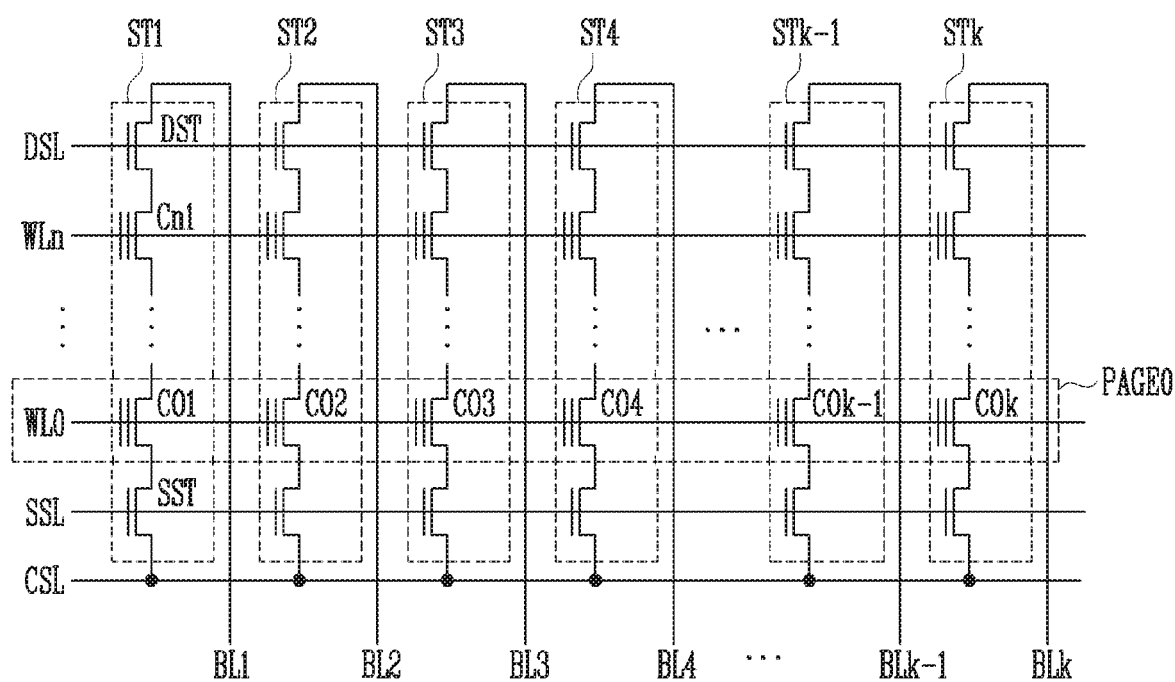
FIG. 5 is a circuit diagram illustrating a memory block shown in FIG. 4.

FIG. 5 is a circuit diagram illustrating the memory block shown in FIG. 4.

Referring to FIG. 5, each memory block includes a plurality of strings ST1 to STk coupled between bit lines BL1 to BLk and a common source line CSL. That is, the strings ST1 to STk are coupled to corresponding bit lines BL1 to BLk, respectively, and are commonly coupled to the common source line CSL. Each string ST1 includes a source select transistor SST having a source coupled to the common source line CSL, a plurality of memory cells C01 to Cn1, and a drain select transistor DST having a drain coupled to the bit line BL1. The memory cells C01 to Cn1 are coupled in series between the select transistors SST and DST. A gate of the source select transistor SST is coupled to a source select line SSL, gates of the memory cells C01 to Cn1 are coupled to word lines WL0 to WLn, respectively, and a gate of the drain select transistor DST is coupled to a drain select line DSL.

Memory cells included in a memory block may be divided into units of physical pages or logical pages. For example, the memory cells C01 to C0k coupled to one word line (e.g., WL0) constitute one physical page PAGE0.

Figure 6:
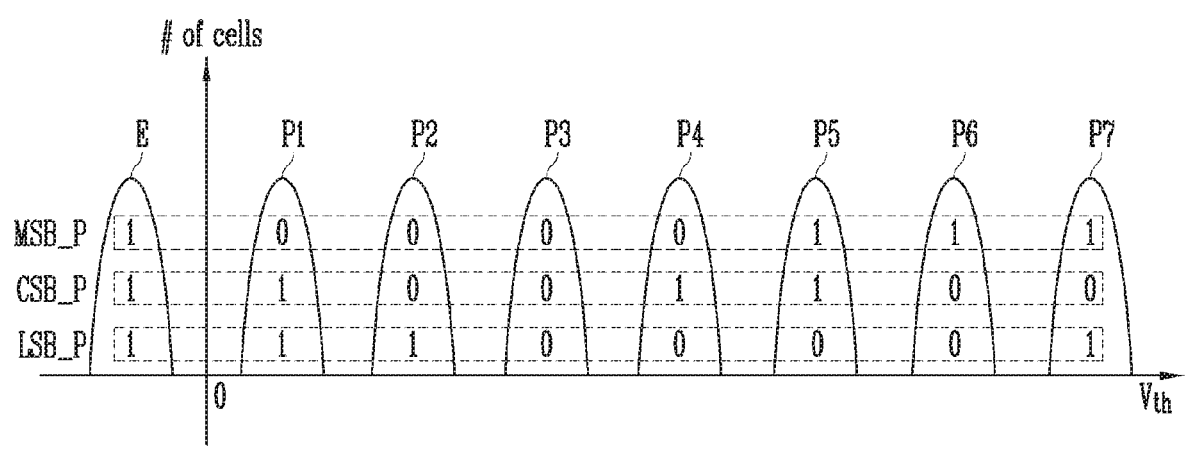
FIG. 6 is a threshold voltage distribution diagram illustrating a threshold voltage distribution of memory cells.

FIG. 6 is a threshold voltage distribution diagram illustrating a threshold voltage distribution of memory cells.

Each of the memory cells in accordance with the embodiment of the present disclosure may store a plurality of data bits. For example, a memory cell storing data of two bits is referred to as a Multi-Level Cell (MLC), a memory cell storing data of three bits is referred to as a Triple Level Cell (TLC), and a memory cell storing data of four bits is referred to as a Quadruple Level Cell (QLC). The embodiment of the present disclosure may be applied to cells storing data of two bits or more. Hereinafter, the TLC will be described as an example.

Referring to FIG. 6, a plurality of memory cells may be programmed to an erase state E and first to seventh program states P1 to P7, to each store data including MSB data, CSB data, and LSB data.

Memory cells coupled to one word line may be defined as one physical page (e.g., PAGE0) of FIG. 5. An MSB data group of the memory cells included in the one physical page may be defined as an MSB page MSB_P, a CSB data group of the memory cells included in the one physical page may be defined as a CSB page CSB_P, and an LSB data group of the memory cells included in the one physical page may be defined as an LSB page LSB_P. That is, the one physical page may include a plurality of pages (e.g., the MSB page MSB_P, the CSB page CSB_P, and the LSB page LSB_P).

FIG. 7 is a flowchart illustrating a method for operating the memory system in accordance with an embodiment of the present disclosure.

Figure 8A:
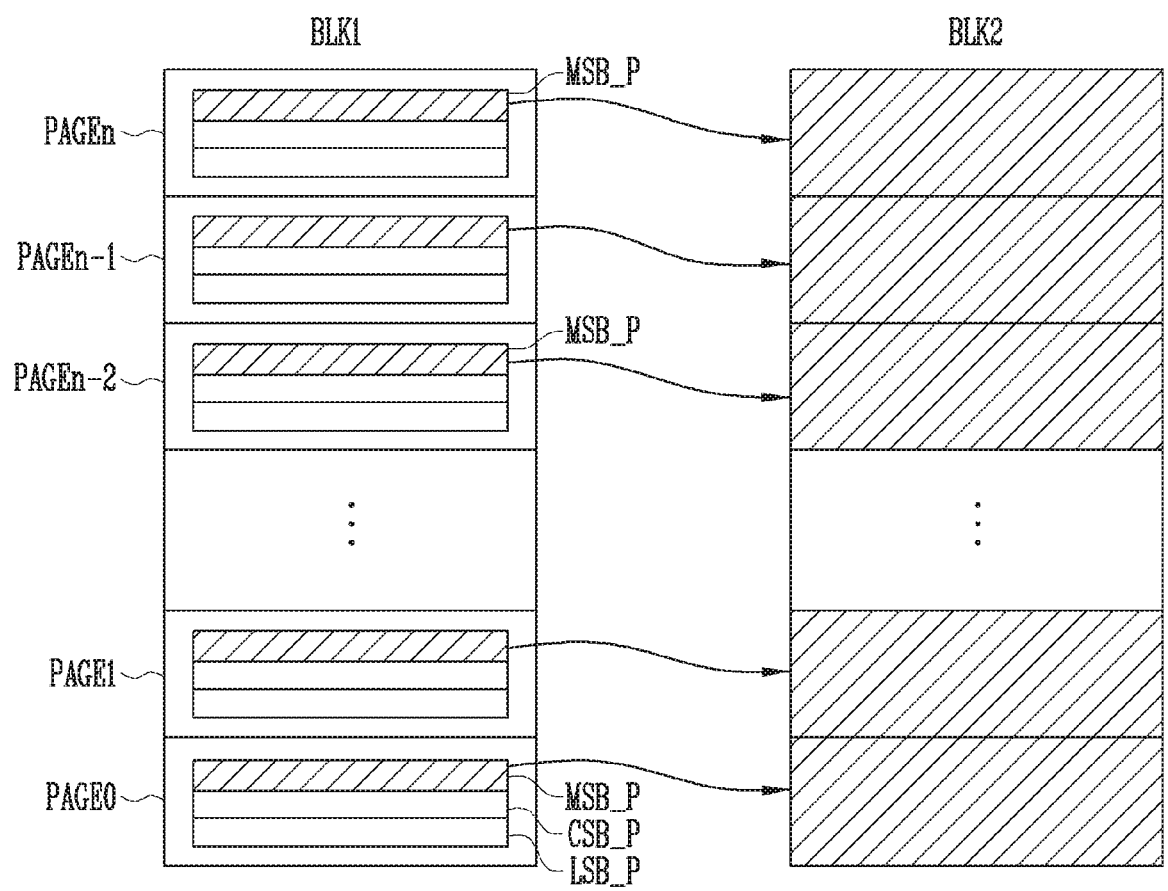
FIGS. 8A and 8B are diagrams illustrating a data backup operation of a selected page in accordance with an embodiment of the present disclosure.
Figure 8B:
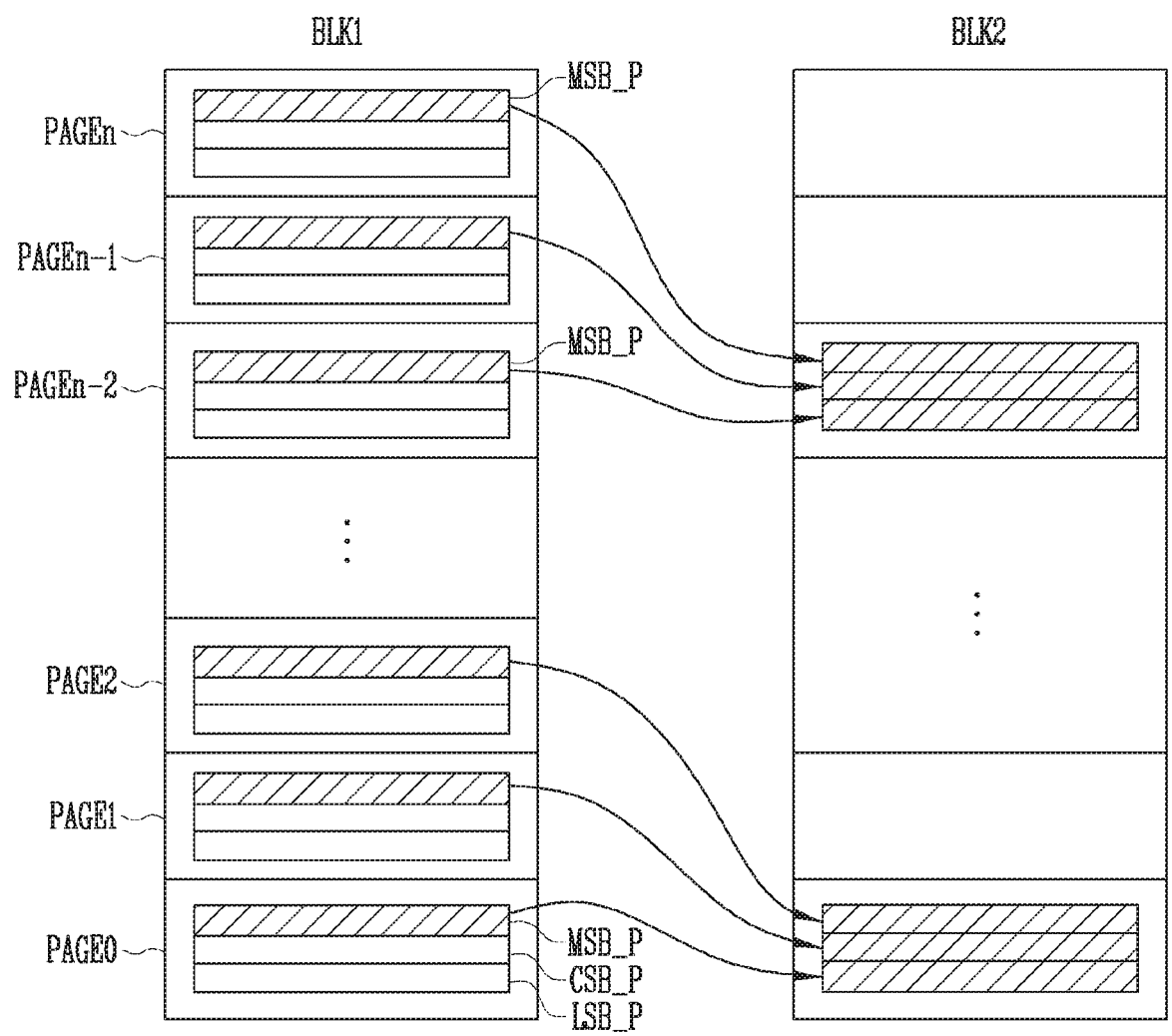

FIGS. 8A and 8B are diagrams illustrating a data backup operation of a selected page in accordance with an embodiment of the present disclosure.

A read operation of the memory system in accordance with an embodiment of the present disclosure will be described as follows with reference to FIGS. 7 to 8B.

When a request corresponding to the read operation is received from the host 1400, the processor 1220 of the controller 1200 generates a command queue corresponding to the read operation, and the flash control circuit 1240 of the controller 1200 outputs a command for controlling a read operation of a selected semiconductor memory 100 among the semiconductor memories 100 of the memory device 1100 in response to the command. Also, the processor 1220 translates a logical address included in a request corresponding to the read operation into a physical address, and provides the semiconductor memory 100 with the translated address together with a command corresponding to the read operation.

The control circuit 120 of the semiconductor memory 100 performs a read operation on a selected page of a selected memory block among the plurality of memory blocks in response to a command CMD for a read operation and an address ADD, which are received from the controller 1200 (S710). The selected page may be one of a plurality of physical pages. Also, the selected page may be one of a plurality of logical pages included in the selected physical page.

In the read operation, the control circuit 120 generates a voltage control signal VCON, a row address signal RADD, a PB control signal PBCON in response to the command CMD and the address ADD, and outputs the generated signals to the voltage supply circuit 130 and the page buffer group 140. The voltage supply circuit 130 applies operating voltages (e.g., a read voltage and a pass voltage) necessary for a read operation of memory cells to the word lines WLs in response to the voltage control signal VCON. The page buffers PB1 to PBk of the page buffer group 140 read data stored in the selected logical page by sensing voltages or currents of the corresponding bit lines BL1 to BLk in response to the PB control signal PBCON of the control circuit 120. The read data DATA is output to the controller 1200 through the column decoder 150 and the input/output circuit 160.

An ECC operation on the data received from the semiconductor memory 100 may be performed by the ECC circuit 1280 of the controller 1200 (S720). The ECC circuit 1280 performs ECC decoding on data received from the semiconductor memory 100 through the flash interface 1290. The ECC circuit 1280 detects and corrects an error of the data received from the semiconductor memory 100, using an ECC.

As the result (S730) of the ECC operation performed by the ECC circuit 1280, when the number of detected error bits is equal to or smaller than a maximum tolerable error bit number of the ECC circuit 1280, the ECC circuit 1280 may successfully perform the ECC operation on the data received from the semiconductor memory 100 (Pass). On the other hand, when the number of detected error bits is larger than the maximum tolerable error bit number of the ECC circuit 1280, the ECC circuit 1280 cannot normally perform the ECC operation on the data received from the semiconductor memory 100 (Fall).

When it is determined that the ECC operation performed by the ECC circuit 1280 has passed (Pass), a read count of the selected page is compared with a set value a (S740). The read count is a value obtained by counting a read operation number up to the present after the selected page is completely programmed.

As the result (S740) obtained by comparing the read count and the set value a, when it is determined that the read count of the selected page is smaller than the set value a (Yes), it is determined that it is little likely that the read disturb will occur in the selected page, and it is determined that the read operation on the selected page has succeeded (S780).

As the result (S740) obtained by comparing the read count and the set value a, when it is determined that the read count of the selected page is equal to or larger than the set value a (No), it is determined whether an MSB page backup operation history of the selected memory block including the selected page exists (S750).

As the determination result (S750), when the MSB page backup operation history of the selected memory block exists (Yes), the read operation on the selected page has succeeded (S780).

As the determination result (S750), when the MSB page backup operation history of the selected memory block does not exist (No), a backup operation of all MSB pages included in the selected memory block is performed (S760), and then it is determined that the read operation on the selected page has succeeded (S780).

The backup operation of the MSB pages will be described as follows with reference to FIGS. 8A and 8B.

Referring to FIG. 8A, data of MSB pages MSB_P, which is vulnerable to the read disturb, among a plurality of logical pages MSB_P, CSB_P, and LSB_P included in a physical page PAGE0 of a selected memory block BLK1 are read, and the read data of the MSB pages MSB_P are stored in a physical page of a new memory block BLK2. The new memory block BLK2 may be defined as a backup block. In an embodiment, the data of the MSB pages MSB_P of the selected memory block BLK1 are moved into the physical page of the new memory block BLK2. In another embodiment, an ECC operation may be performed on the read data of the MSB pages MSB_P, using the ECC circuit 1280, and the data on which the ECC operation has been performed may be stored in the new memory block BLK2. The data moved into the physical page of the memory block BLK2 may be programmed using a Triple Level Cell (TLC) scheme that is a program scheme of the memory block BLK1, or be programmed using a Single Level Cell (SLC) scheme having a higher reliability of data as compared with the TLC scheme.

In the above-described backup operation, the plurality of MSB pages MSB_P included in the memory block BLK1 may be backed up and stored in a plurality of physical pages of the new memory block BLK2, respectively.

Referring to FIG. 8B, data of all MSB pages MSB_P of a selected memory block BLK1 are moved in a physical page of a new memory block BLK2. Data of three MSB pages may be moved into one physical page of the new memory block BLK2. That is, data of three MSB pages included in the selected memory block BLK1 may be moved into one physical page of the new memory block BLK2. The data moved into the physical page of the memory block BLK2 are preferably programmed using the TLC scheme that is a program scheme of the memory block BLK1.

In an embodiment, the data of the MSB pages MSB_P of the selected memory block BLK1 are moved into the physical page of the new memory block BLK2. In another embodiment, an ECC operation may be performed on the read data of the MSB pages MSB_P, using the ECC circuit 1280, and the data on which the ECC operation has been performed may be stored in the new memory block BLK2.

In the above-described MSB page backup operation, the data of the plurality of MSB pages MSB_P included in the memory block BLK1 are backed up and stored in a plurality of physical pages of the new memory block BLK2, and are stored in a plurality of logical pages MSB_P, CSB_P, and LSB_P in the physical page, so that a backup space can be efficiently managed. For example, the memory block BLK2 is a storage space corresponding to ⅓ of the memory block BLK1, and may back up and store the MSB pages MSB_P of the memory block BLK1.

In the backup operation according to FIG. 8A, the reliability of stored data can be improved as compared with the backup operation according to FIG. 8B. In the backup operation according to FIG. 8B, a storage space can be efficiently used as compared with the backup operation according to FIG. 8A.

As the result (S730) of the ECC operation performed by the ECC circuit 1280, when it is determined that the ECC operation has failed (Fall), a hard decoding operation is performed (S790). The hard decoding operation is preferably a decoding operation using hard decision data read using a hard decoding read voltage. The hard decoding operation may be an ECC decoding operation using a Turbo Product Code (TPC). Also, the hard decoding operation may be an ECC decoding operation using a Bose-Chaudhuri-Hocquenghem (BCH) code.

As the result (S800) of the hard decoding operation, when it is determined that the hard decoding operation has passed (Pass), the steps are performed from the step 740. As the result (S800) of the hard decoding operation, when it is determined that the hard decoding operation has failed (Fall), a soft decoding operation is performed (S810). The soft decoding operation is preferably a decoding operation using soft decision data read using a soft decoding read voltage. The soft decoding read voltage is preferably different from the hard decoding read voltage. The soft decoding operation may be an ECC decoding operation using a TPC or an ECC decoding operation using a BCH code.

As the result (S820) of the soft decoding operation, when it is determined that the soft decoding operation has failed (Fall), it is determined that the read operation on the selected page has failed (S830), and the read operation is ended.

As the result (S820) of the soft decoding operation, when it is determined that the soft decoding operation has passed (Pass), it is determined whether the selected page is an MSB page (S840).

When it is determined that the selected page is the MSB page (Yes) and an MSB backup operation history of the selected memory block exists, the address of the selected page is updated to the address of the new memory block BLK2 in which data of the selected page is backed up such that the backed-up data are read in a next read operation (S850). When it is determined that the selected page is the MSB page (Yes) and the MSB backup operation history of the selected memory block does not exist, it is determined that the read operation on the selected page has succeeded without the above-described address update operation, and the read operation is ended.

On the other hand, when it is determined that the selected page is not the MSB page (No), it is determined that the selected page is an LSB page or CSB page, and a read reclaim operation on the selected page is performed (S860). Then, it is determined that the read operation on the selected page has succeeded (S780), and the read operation is ended.

As described above, the embodiment of the present disclosure, when the selected page is a logical page (e.g., an MSB page) that is vulnerable to the read disturb, data of MSB pages included in the selected memory block are backed up and stored when the read count of the selected page reaches the set value, so that the read disturb of the selected page can be suppressed. Thus, the lifespan of the memory system can be maximally ensured.

In the embodiment of the present disclosure, it is described, when the selected page is a logical page vulnerable to the read disturb, data of the selected page are backed up, and the backed-up data are read in a next read operation. However, in addition, parity data generated by performing an XOR logic operation on data of a plurality of logical pages vulnerable to the read disturb, which are included in one memory block, e.g., a plurality of MSB pages included in one memory block are backed up and stored, so that the relability of the plurality of logical pages vulnerable to the read disturb can be improved.

Figure 9:
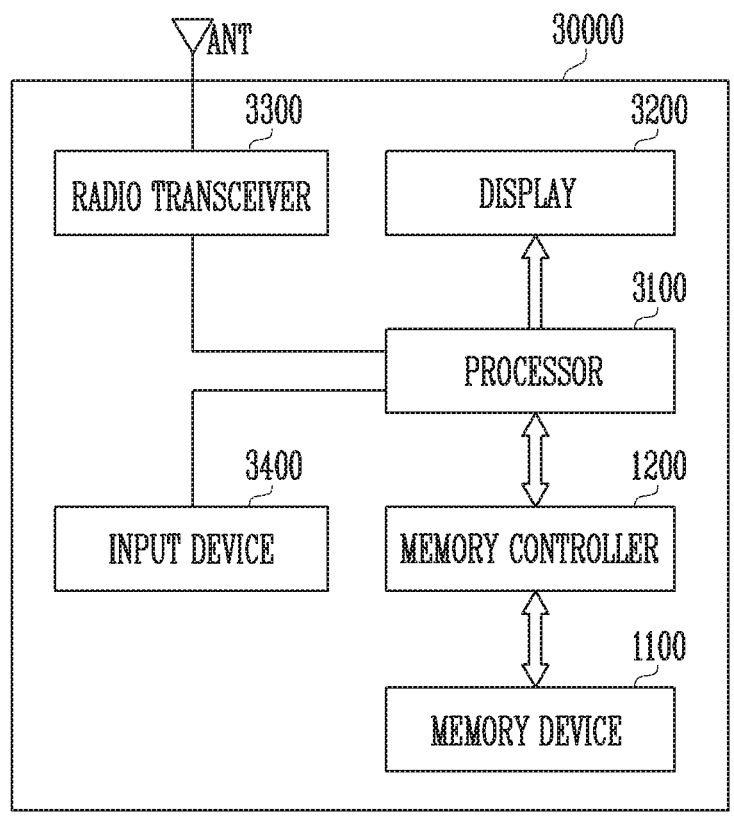
FIG. 9 is a diagram illustrating another embodiment of the memory system.

FIG. 9 is a diagram illustrating another embodiment of the memory system.

Referring to FIG. 9, the memory system 30000 may be implemented as a cellular phone, a smart phone, a tablet PC, a personal digital assistant (PDA), or a wireless communication device. The memory system 30000 may include a memory device 1100 and a controller 1200 capable of controlling an operation of the memory device 1100. The controller 1200 may control a data access operation of the memory device 1100, e.g., a program operation, an erase operation, a read operation, or the like under the control of a processor 3100.

Data programmed in the memory device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the memory device 1100 may be implemented as a part of the processor 3100, or be implemented as a chip separate from the processor 3100. Also, the controller 1200 may be implemented with the controller 1200 shown in FIG. 2.

Figure 10:
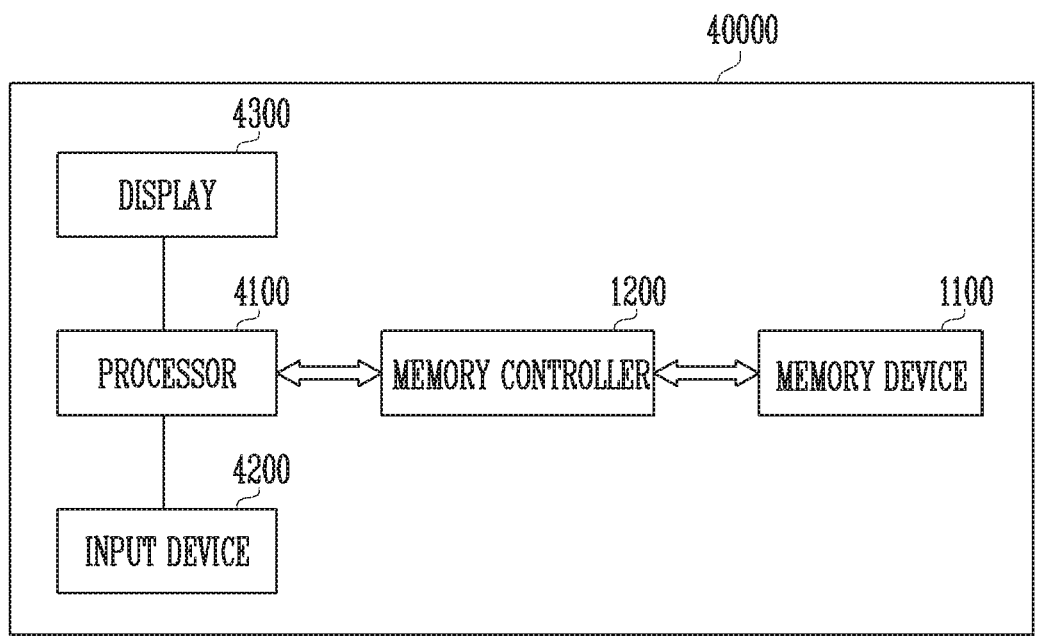
FIG. 10 is a diagram illustrating another embodiment of the memory system.

FIG. 10 is a diagram illustrating another embodiment of the memory system.

Referring to FIG. 10, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the controller 1200. In some embodiments, the controller 1200 capable of controlling an operation of the memory device 1100 may be implemented as a part of the processor 4100, or be implemented as a chip separate from the processor 4100. Also, the controller 1200 may be implemented with the controller 1200 shown in FIG. 2.

Figure 11:
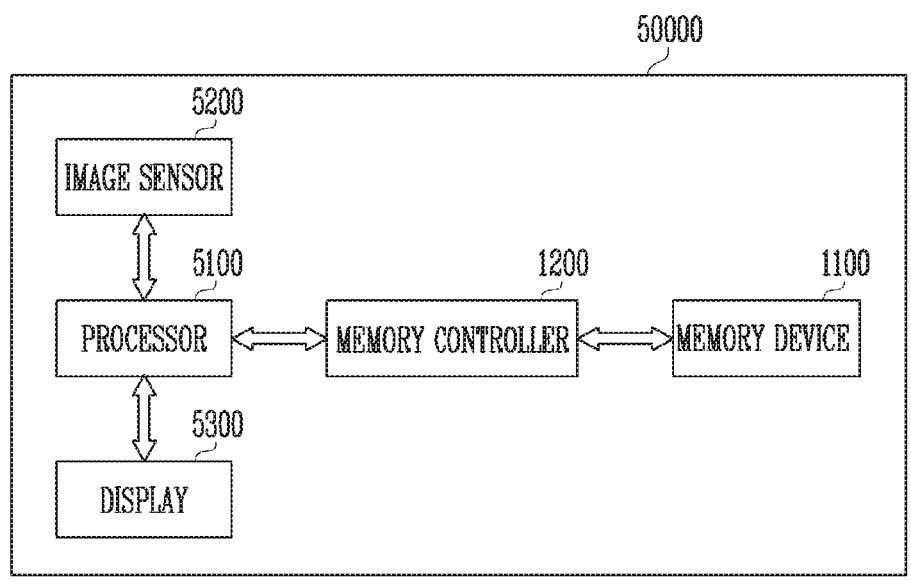
FIG. 11 is a diagram illustrating another embodiment of the memory system.

FIG. 11 is a diagram illustrating another embodiment of the memory system.

Referring to FIG. 11, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the controller 1200. Under the control of the processor 5100, the converted digital signals may be output through a display 5300, or be stored in the memory device 1100 through the controller 1200. In addition, data stored in the memory device 1100 may be output through the display 5300 under the control of the processor 5100 or the controller 1200.

In some embodiments, the controller 1200 capable of controlling an operation of the memory device 1100 may be implemented as a part of the processor 5100, or be implemented as a chip separate from the processor 5100. Also, the controller 1200 may be implemented with the controller 1200 shown in FIG. 2.

Figure 12:
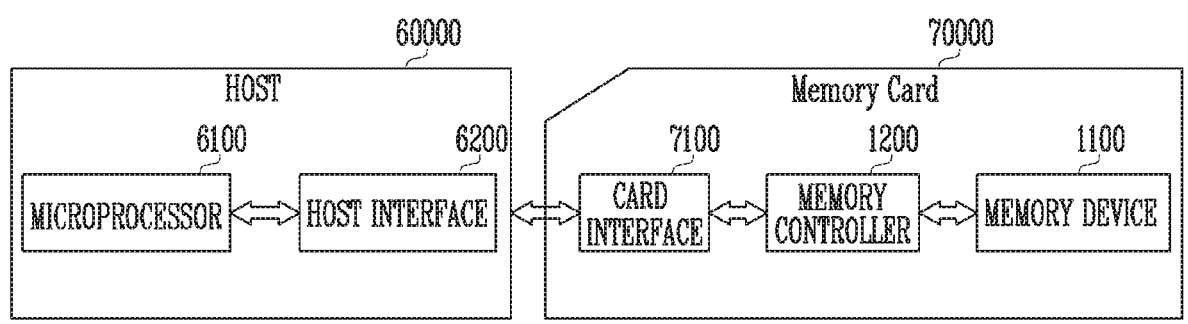
FIG. 12 is a diagram illustrating another embodiment of the memory system.

FIG. 12 is a diagram illustrating another embodiment of the memory system.

Referring to FIG. 12, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) Interface, but the present disclosure is not limited thereto. Also, the controller 1200 may be implemented with the controller 1200 shown in FIG. 2.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor 6100.

In accordance with the present disclosure, data of a page vulnerable to the read disturb are selectively backed up and stored, and then the backed-up data are read in a read operation of the selected page, so that the lifespan of the memory system can be maximally ensured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
   a memory cell array including a plurality of memory blocks;
   a peripheral circuit configured to perform a read operation on a selected memory block among the plurality of memory blocks, and a backup program operation on a backup block among the plurality of memory blocks; and
   a control circuit configured to control the peripheral circuit to backup data of weak pages included in the selected memory block in the backup block when a read count of a selected physical page of the selected memory block is equal to or larger than a set value in the read operation on the selected memory block,
   wherein the plurality of memory blocks include a plurality of physical pages,
   wherein each of the plurality of physical pages comprises a Least Significant Bit (LSB) page, a Central Significant Bit (CSB) page, and a Most Significant Bit (MSB) page, and
   wherein each of the weak pages is the MSB page.

2. The memory device of claim 1, wherein the peripheral circuit stores, in the backup operation, the data of the weak pages included in the selected memory block in one selected physical page among the plurality of physical pages of the backup block.

3. A memory system comprising:
   a memory device including a plurality of memory blocks, the memory device reading and outputting data stored in a selected page of a selected memory block among the plurality of memory blocks in a read operation; and
   a controller configured to control the memory device to perform the read operation in response to a request from a host,
   wherein the controller controls, when a read count of the selected page is equal to or larger than a set value in the read operation, the memory device to perform a backup operation of storing data of weak logical pages included in the selected memory block including the selected page in a backup block among the plurality of memory blocks,
   wherein the plurality of memory blocks include a plurality of physical pages,
   wherein each of the plurality of physical pages comprises a Least Significant Bit (LSB) page, a Central Significant Bit (CSB) page, and a Most Significant Bit (MSB) page, and
   wherein each of the weak logical pages is the MSB page.

4. The memory system of claim 3, wherein the controller includes:
   a processor configured to generate a command queue for controlling the memory device in the request from the host; and
   an Error Correction Code (ECC) circuit configured to perform an ECC operation on data received from the memory device in the read operation.

5. The memory system of claim 4, wherein, when it is determined that the ECC operation has passed in the read operation and the read count of the selected page is equal to or larger than the set value, the processor generates the command queue corresponding to the backup operation of the weak logical pages of the selected memory block.

6. The memory system of claim 4, wherein, when it is determined that the ECC operation has passed in the read operation, the read count of the selected page is equal to or larger than the set value, and a backup operation history of the memory block does not exist, the processor generates the command queue corresponding to the backup operation of the weak logical pages of the selected memory block.

7. The memory system of claim 3, wherein, in the backup operation, the memory device stores the data of the weak logical pages included in the selected memory block in one selected physical page among the plurality of physical pages of the backup block.

8. The memory system of claim 4,
   wherein, when it is determined that the ECC operation has failed in the read operation, the controller controls the memory device to perform a hard decoding operation and a soft decoding operation,
   wherein, when it is determined that the soft decoding operation has passed and the selected page is not the weak logical page, the controller controls the memory device to perform a read reclaim operation.

9. The memory system of claim 8, wherein, when it is determined that the soft decoding operation has passed and the selected page is the weak logical page, the controller updates an address of the selected page to an address at which the backup operation has been performed.

10. A method of operating a memory system, the method comprising:
    performing a read operation on a selected page included in a selected memory block among a plurality of memory blocks and an Error Correction Code (ECC) operation on read data;
    comparing a read count of the selected page with a set value, when it is determined that the ECC operation has passed; and
    performing a backup operation of weak logical pages included in the selected memory block, when the read count is equal to or larger than the set value,
    wherein the plurality of memory blocks include a plurality of physical pages,
    wherein each of the plurality of physical pages comprises a Least Significant Bit (LSB) page, a Central Significant Bit (CSB) page, and a Most Significant Bit (MSB) page, and
    wherein each of the weak logical pages is the MSB page.

11. The method of claim 10,
    further comprising determining a history in which the backup operation on the selected memory block has been performed, when the read count is equal to or larger than the set value,
    wherein the backup operation on the selected memory block is performed when the history in which the backup operation has been performed does not exist.

12. The method of claim 10, wherein the backup operation stores the data stored in each of the weak logical pages in a plurality of pages of the backup block, using a Single Level Cell (SLC) scheme.

13. The method of claim 10, wherein data of at least one weak logical page among the weak logical pages is stored, in the backup operation, in one page among the plurality of pages of the backup block.

14. The method of claim 10, further comprising performing a hard decoding operation and a soft decoding operation on the selected page, when it is determined that the ECC operation has failed.

15. The method of claim 14, wherein the operations are re-performed from the comparing of the read count with the set value, when it is determined that the hard decoding operation has passed.

16. The method of claim 14, further comprising updating an address of the selected page as an address at which the backup operation has been performed, when it is determined that the soft decoding operation has passed and the selected page is the weak logical page.

17. The method of claim 14, further comprising performing a read reclaim operation on the selected page, when it is determined that the soft decoding operation has passed and the selected page is not the weak logical page.

* * * * *